US006768142B2

(12) United States Patent
Ali et al.

(10) Patent No.: US 6,768,142 B2
(45) Date of Patent: Jul. 27, 2004

(54) CIRCUIT COMPONENT PLACEMENT

(75) Inventors: Anwar Ali, San Jose, CA (US);
Tauman T. Lau, San Jose, CA (US);
Max M. Yeung, San Jose, CA (US);
Ken Nguyen, San Jose, CA (US); Wei Huang, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/140,965

(22) Filed: May 8, 2002

(65) Prior Publication Data

US 2003/0209731 A1 Nov. 13, 2003

(51) Int. Cl.[7] .............................................. H01L 27/10
(52) U.S. Cl. ...................... 257/203; 257/786; 257/782; 257/459; 257/202; 257/207; 257/208; 257/211; 257/784; 257/779; 257/780; 257/773; 257/775; 257/776; 257/691; 438/128; 438/129; 438/612; 438/666
(58) Field of Search ............................... 257/208, 211, 257/784, 779, 780, 773, 775, 776, 691, 203, 786, 782, 202, 459; 438/612, 666, 128, 129

(56) References Cited

U.S. PATENT DOCUMENTS

| | | | |
|---|---|---|---|
| 5,216,280 A | * | 6/1993 | Tanaka et al. ............... 257/734 |
| 5,552,333 A | | 9/1996 | Cheung et al. ................ 437/51 |
| 5,777,354 A | * | 7/1998 | Cheung et al. .............. 257/202 |
| 6,404,226 B1 | * | 6/2002 | Schadt ......................... 326/41 |
| 6,489,688 B1 | * | 12/2002 | Baumann et al. ........... 257/786 |

* cited by examiner

Primary Examiner—Steven Loke
Assistant Examiner—Junghwa Im
(74) Attorney, Agent, or Firm—Luedeka, Neely & Graham

(57) ABSTRACT

A method for designing an input output cell of an integrated circuit. The input output cell has a required area, a width, and a height. The bonding pad pitch length between adjacent bonding pads of the integrated circuit is measured. The width of the input output cell is specified to be substantially equal to the bonding pad pitch length. The required area is divided by the width to determine a first value, and the height of the input output cell is specified to be substantially equal to the first value. In this manner, the width of the input output cells is no greater than the distance between two adjacent bonding pads, and thus the input output cells can be placed very close together, facilitating their use in input output limited integrated circuit designs. However, the height of the input output cells is no greater than is necessary to enclose the required area of the input output cell, thus facilitating their use in core limited integrated circuit designs. In various preferred embodiments, the bonding pads for the input output cells are disposed within their surface areas, thereby further reducing the surface area of the integrated circuit that is required for the input output functions of the integrated circuit.

11 Claims, 7 Drawing Sheets

CIRCUIT COMPONENT PLACEMENT

FIELD

This invention relates to the field of integrated circuit fabrication. More particularly, this invention relates to input output cell design and placement for integrated circuits.

BACKGROUND

The surface of an integrated circuit such as an ASIC or an ASSP can be logically divided into two different portions, being the input output of the integrated circuit, and the core 20 of the integrated circuit as depicted in FIGS. 4 and 5. As depicted in FIG. 1, the input output of the integrated circuit 10a includes input output cells 14a that are connected to bonding pads 16, such as by lines 18, and to the core 20 of the integrated circuit 10a, such as by lines 22. Thus, all communication with the core 20 of the integrated circuit 10a is typically handled through the input output of the integrated circuit 10a.

Integrated circuits are typically categorized as being either input output limited, as depicted in FIG. 4, or core limited as depicted in FIG. 5. An input output limited integrated circuit 10a, as depicted in FIG. 4, is one in which the size of the substrate on which the integrated circuit is formed is predominantly determined by the space required by the input output cells 14a. In other words, any additional input output cells 14a required by an input output limited integrated circuit 10a results in an increase in the size of the substrate. Typically, more than a single row of bonding pads 16a and 16b is required around the peripheral edge of an input output limited integrated circuit 10a. In an input output limited integrated circuit 10a, there is typically ample surface area for the space requirements of the core cells 20.

On the other hand, a core limited integrated circuit 10b, as depicted in FIG. 5, is one in which the size of the substrate on which the integrated circuit 10b is formed is predominantly determined by the space required by the core cells 20. In other words, any additional core cells 20 required by a core limited integrated circuit 10b results in an increase in the size of the substrate. Typically, only a single row of bonding pads 16 is required around the peripheral edge of a core limited integrated circuit 10b. In a core limited integrated circuit 10b there is typically ample surface area for the space requirements of the input output cells 14a.

In an input output limited integrated circuit 10a (FIG. 4), the input output cells 14a are typically narrow and tall, meaning that the length of the input output cell 14a along an edge that is substantially parallel to the peripheral edge 12 of the integrated circuit 10a tends to be appreciably shorter than the length of an edge that is substantially perpendicular to the peripheral edge 12 of the integrated circuit 10a such as depicted in FIG. 1. In this manner, many input output cells can be placed along the length of the peripheral edges 12 of the integrated circuit 10a. Although the tall input output cells 14a tend to extend relatively far into the core 20 of the integrated circuit 10a this is typically not a problem because, as mentioned above, there tends to be ample surface area for the core components of an input output limited integrated circuit 10a.

On the other hand, the tall and narrow design of an input output cell that is optimized for an input output limited integrated circuit is extremely inefficient for a core limited integrated circuit. The reason for this is that in a core limited integrated circuit, the input output cells may be more widely spaced apart, because fewer of them are required. Thus, there tends to be a large amount of wasted surface area between the narrow input output cells in such a design. However, as mentioned above, the tall input output cells tend to extend relatively far into the core of the integrated circuit, which for a core limited integrated circuit is already densely populated. Thus, the height of the tall and narrow input output cells requires the overall size of the substrate on which the integrated circuit is formed to be larger to accommodate the length of the input output cells. Because there is wasted space between the input output cells, this tends to result in a very inefficient use of the substrate surface area, and unnecessarily increases the cost of production of the integrated circuit.

A better design for an input output cell 14b of a core limited integrated circuit 10b would be a relatively wide, relatively short input output cell 14b, as depicted in FIG. 2, which design is substantially the opposite of the aspect ratio of the input output cell 14a designed for an input output limited integrated circuit 10a. However, because most integrated circuits tend to be input output limited rather than core limited, there are typically many input output cell designs that are available for use in an input output limited integrated circuit 10a design.

Because it is complicated and time consuming to develop a new input output cell design, and such a design for a core limited integrated circuit would tend to be used very little, many designers just use the input output cells that are designed for input output limited integrated circuits, even when they have a core limited integrated circuit, so that they do not have to take the time and expense of designing an input output cell for the core limited integrated circuit. Although this results in an integrated circuit that is more expensive than is necessary, it is often less expensive than taking the time to create a new core limited input output cell design.

Adding to this problem is the surface area on the substrate which is taken by the corner cells 24, where input output cells 14 cannot be placed, as depicted in FIG. 3. The corner cells 24 are typically disposed in the corners of the integrated circuit 10, where the buss lines, such as VSS 32, VDD 30, IDDtn (not depicted so as to enhance the clarity of the figure), VDDio 28, and VSSio 26 are turned at the corner from tracking in a parallel fashion a first peripheral edge 12a of the integrated circuit 10 to an adjoining second peripheral edge 12b of the integrated circuit 10 that is perpendicular to the first peripheral edge 12a. Because the buss lines 26, 28, 30, and 32 cut through the corner cell 24 at an angle, a standard input output cell 14 cannot be placed in the corner region inhabited by the corner cell 24, because it would not make proper electrical connections with the buss lines 26, 28, 30, and 32, which are not disposed in the same positions in the corner regions as they are along the peripheral edges.

Thus, there is a need for integrated circuit designs and elements that overcome these and other problems.

SUMMARY

The above and other needs are met by a method for designing an input output cell of an integrated circuit. The input output cell has a required area, a width, and a height. The bonding pad pitch length between adjacent bonding pads of the integrated circuit is measured. The width of the input output cell is specified to be substantially equal to the bonding pad pitch length. The required area is divided by the width to determine a first value, and the height of the input output cell is specified to be substantially equal to the first value.

In this manner, the width of the input output cells is no greater than the distance between two adjacent bonding pads, and thus the input output cells can be placed very close together, facilitating their use in input output limited integrated circuit designs. However, the height of the input output cells is no greater than is necessary to enclose the required area of the input output cell, thus facilitating their use in core limited integrated circuit designs. In various preferred embodiments, the bonding pads for the input output cells are disposed within their surface areas, thereby further reducing the surface area of the integrated circuit that is required for the input output functions of the integrated circuit.

According to another aspect of the invention, electrically conductive buss lines are disposed within a first set of layers along peripheral edges of the integrated circuit. Electrically conductive jumpers are disposed on a second set of layers in corners of the integrated circuit. Electrically conductive vias are disposed in the corners of the integrated circuit for electrically connecting one of the electrically conductive buss lines disposed along a first peripheral edge of the peripheral edges with an associated one of the electrically conductive buss lines disposed along a second adjoining peripheral edge of the peripheral edges through an associated one of the electrically conductive jumpers.

In this manner, the electrically conductive buss lines can extend clear along the peripheral edges of the integrated circuit, and standard input output cells, such as those described herein, can be placed in the corner portions of the integrated circuit, in a position where corner cells have typically been placed. Thus, an integrated circuit according to the present invention provides for additional input output cells to be place on the integrated circuit, in space that was formerly unavailable for such, and thus reduces the space requirements for an integrated circuit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 6:
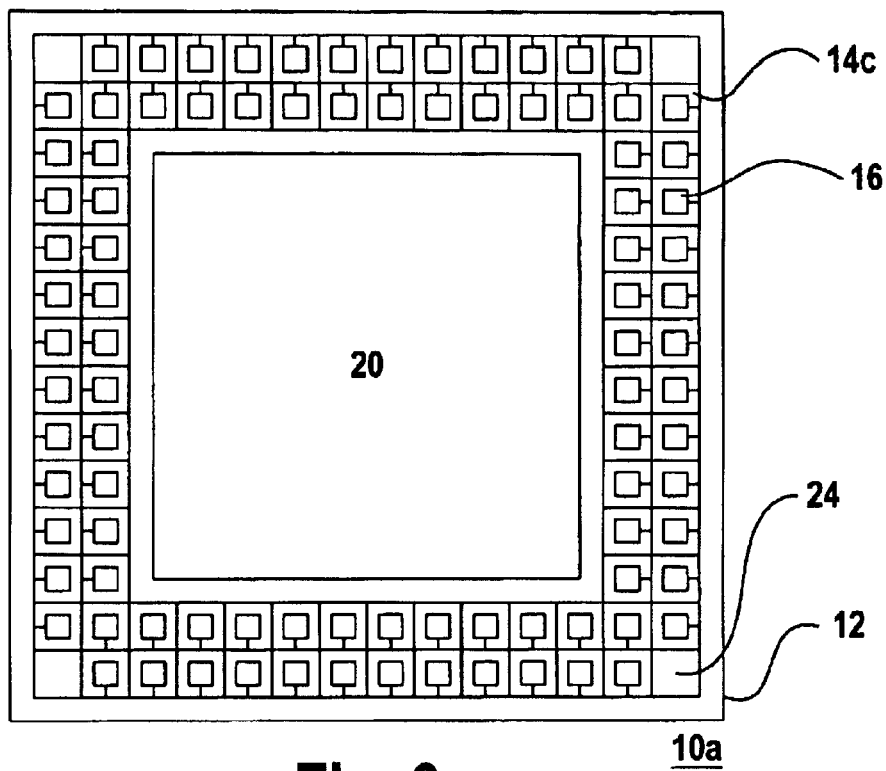
FIG. 6 is a top plan view of an input output limited integrated circuit according to the present invention.

With reference now to FIG. 6 there is depicted an input output limited integrated circuit 10a having input output cells 14c according to a preferred embodiment of the present invention. As depicted, the bonding pad 16 associated with each of the input output cells 14c is preferable disposed within the surface area of a given input output cell 14c. The input output cells 14c are disposed along the peripheral edges 12 of the integrated circuit 10a. In the embodiment depicted in FIG. 6, corner cells 24 are disposed in the corners of the integrated circuit 10a. Multiple rings of the input output cells 16 are used to provide input and output to the core 20 of the input output limited integrated circuit 10a.

Figure 7:
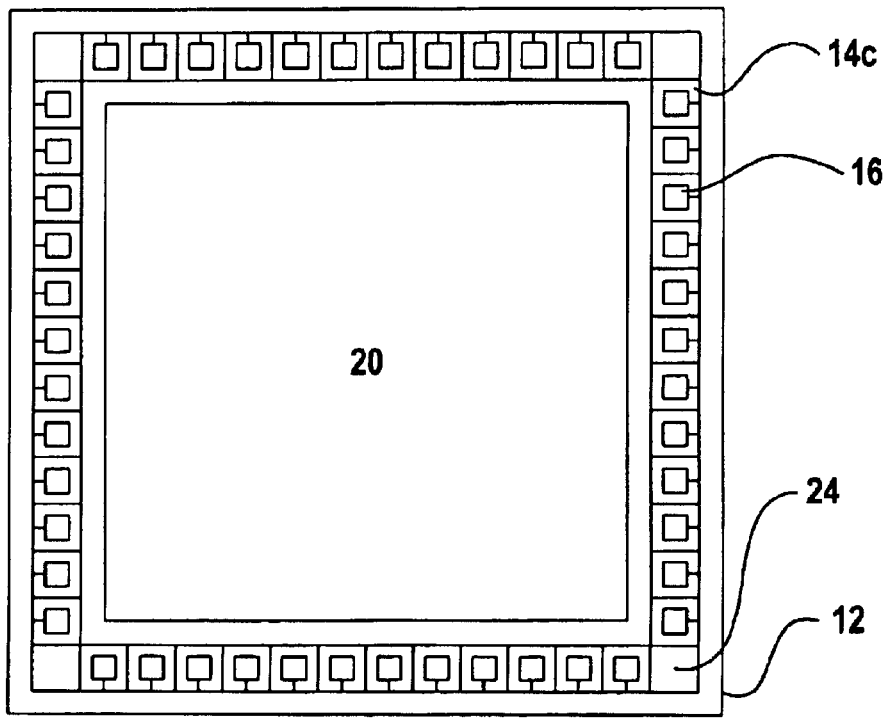
FIG. 7 is a top plan view of a core limited integrated circuit according to the present invention.

With reference to FIG. 7 there is similarly depicted a core limited integrated circuit 10b having input output cells 14c according to a preferred embodiment of the present invention. As noted above, the bonding pad 16 associated with each of the input output cells 14c is preferable disposed within the surface area of a given input output cell 14c.

The input output cells 14c are similarly disposed along the peripheral edges 12 of the integrated circuit 10b. Also in the embodiment depicted in FIG. 7, corner cells 24 are disposed in the corners of the integrated circuit 10b. A single ring of the input output cells 16 is used to provide input and output to the core 20 of the core limited integrated circuit 10b.

Figure 8:
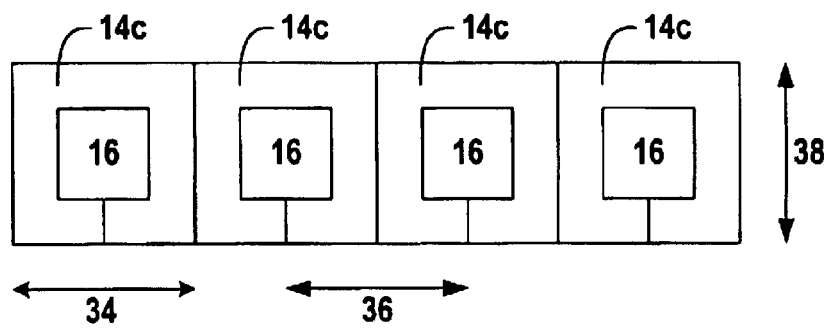
FIG. 8 is a top plan view of input output cells according to a preferred embodiment of the present invention.

Referring now to FIG. 8, the construction of the input output cell 14c is now described. The pitch 36 between adjacent bonding pads 16 is measured, and the width 34 of the input output cell 14c is preferably set at this same length. The width 34 of the input output cell 14c is defined as that dimension of the input output cell 14c that runs substantially parallel with the nearest peripheral edge 12 of the integrated circuit 10. In alternate embodiments the width 34 of the input output cell 14c is set a little bit less than this measured length to facilitate routing electrically conductive lines between adjacent input output cells 14c. The area required by the components within the input output cell 14c is then divided by the specified width 34 of the input output cell 14c, to yield a value that is used as the height 38 of the input output cell 14c. The height 38 of the input output cell 14c is defined as that dimension of the input output cell 14c that runs substantially perpendicular to the nearest peripheral edge 12 of the integrated circuit 10.

Most preferably the distance between the bonding pads 16 is set as the minimum distance allowable by the other design constraints of the integrated circuit 10, most notably the bonding requirements as specified by the packaging elements and packaging processes. Thus, the distance between the bonding pads 16 tends to be different from one technology to another. For example, a flip chip integrated circuit 10 will tend to have difference criteria for the minimum spacing between adjacent bonding pads 16 than will a wire bond integrated circuit 10.

The method of designing an input output cell 14c described above tends produce an input output cell 14c having an aspect ratio that is nearer to one than that of an input output cell 14a designed for an input output limited integrated circuit 10a which will typically have an aspect ratio of two or more, or an input output cell 14b designed for a core limited integrated circuit 10b which will typically have an aspect ratio of one half or less. Thus, an input output cell 14c according to the present invention preferably has an aspect ratio of no greater than about two and no less than about one half. The aspect ratio is the height 38 of the input output cell 14 divided by the width 34 of the input output cell 14.

Figure 11:
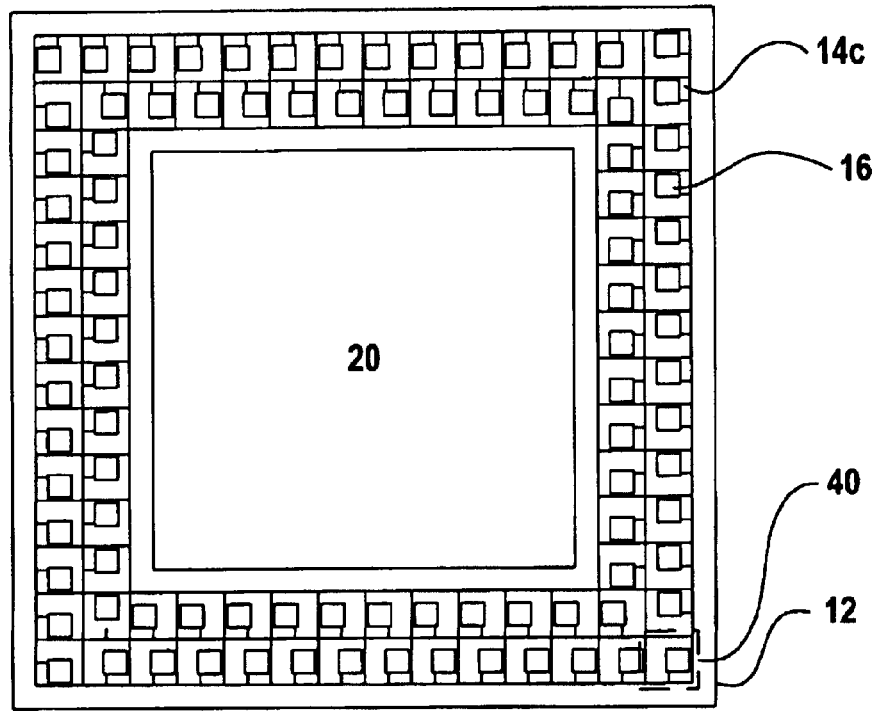
FIG. 11 is a top plan view of an integrated circuit with corner portions and input output cells according to a preferred embodiment of the present invention.

Various adaptations of the designs described above are possible. For example, in the embodiment of FIG. 6, the bonding pads 16 are in the same relative position of each ring of input output cells 14c. In the embodiment of FIG. 11, the bonding pads 16 are in different relative positions of each ring of input output cells 14c, and are thus offset one from another between rings, which preferably facilitates wire bonding. In a similar manner, the input output cells 14c themselves may be offset one from another between rings, which preferably facilitates routing of electrical conductors through lower device density portions of the input output cells 14c.

Alternately, the width 24 of the input output cells 14c may be specified at a value that is somewhat less than the minimum pitch 36 of the bonding pads 16, thus enabling routing of electrical conductors between the input output cells 14c as mentioned above. Ground and power bonding pads may preferably be placed between the outermost ring of input output cells 14c and the peripheral edge 12 of the integrated circuit 10. Such bonding pads and their associated electrically conductive lines are not depicted so as to not unnecessarily encumber the figures.

Figure 1:
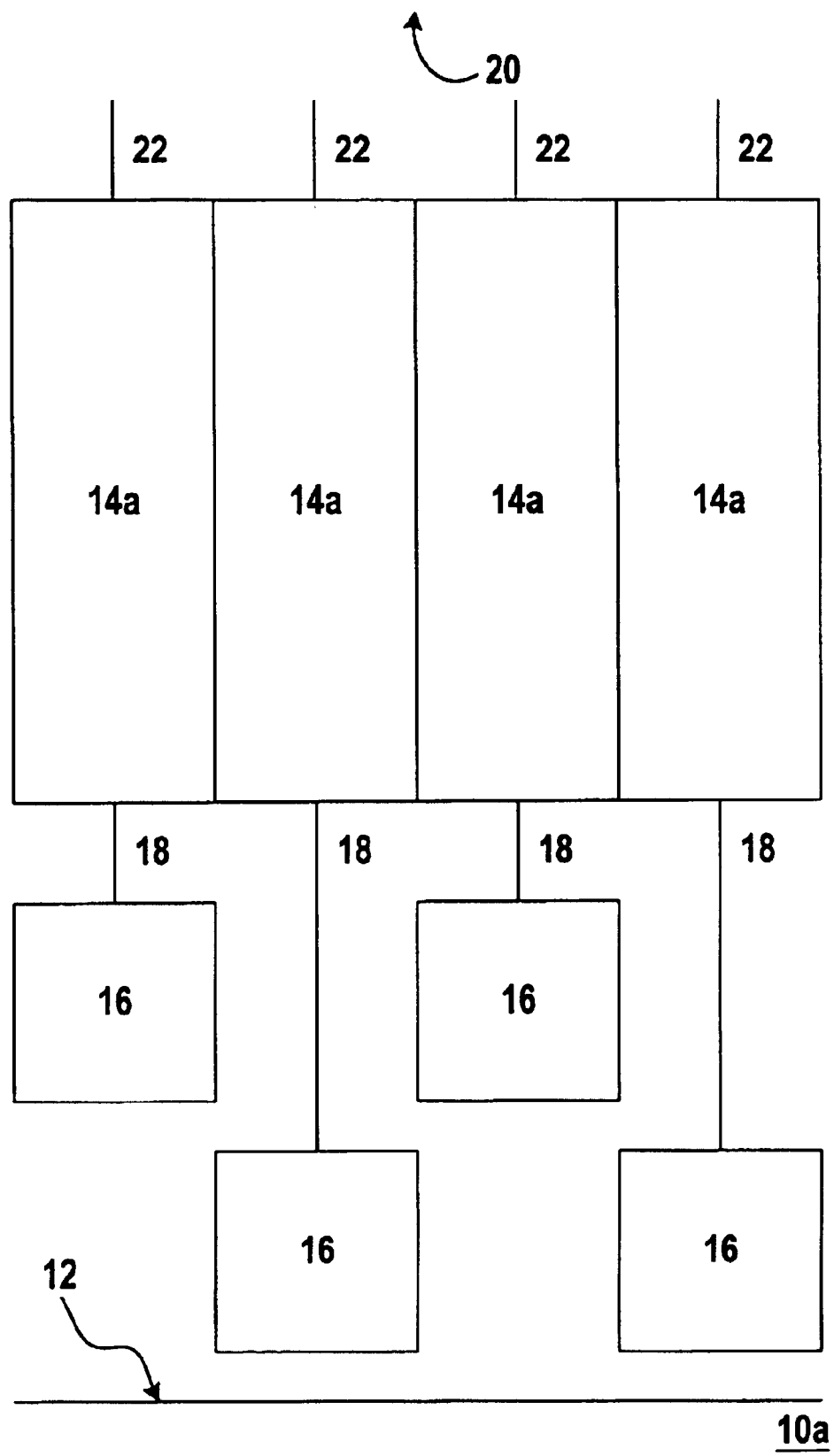
FIG. 1 is a top plan view of prior art input output cells designed for an input output limited integrated circuit.
Figure 2:
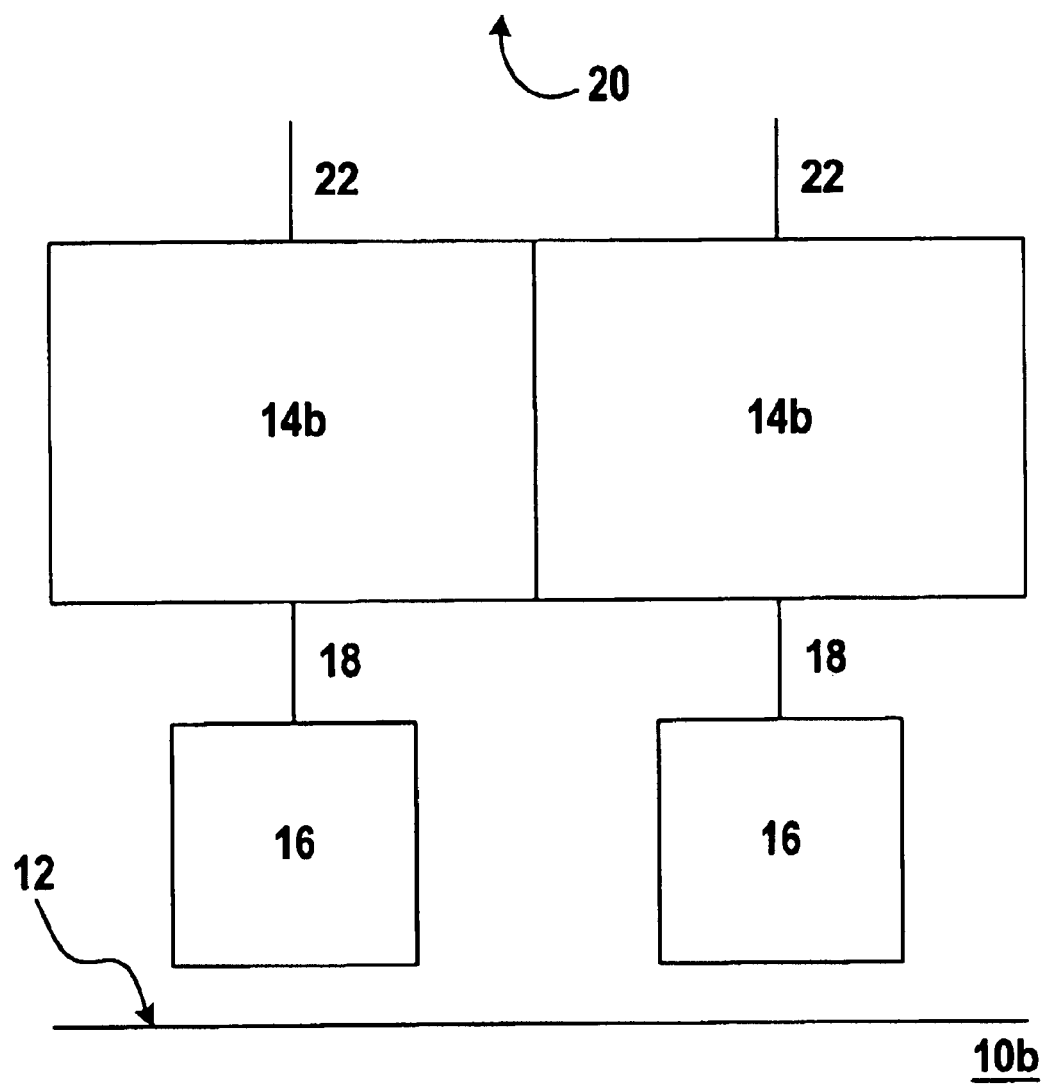
FIG. 2 is a top plan view of prior art input output cells designed for a core limited integrated circuit.
Figure 3:
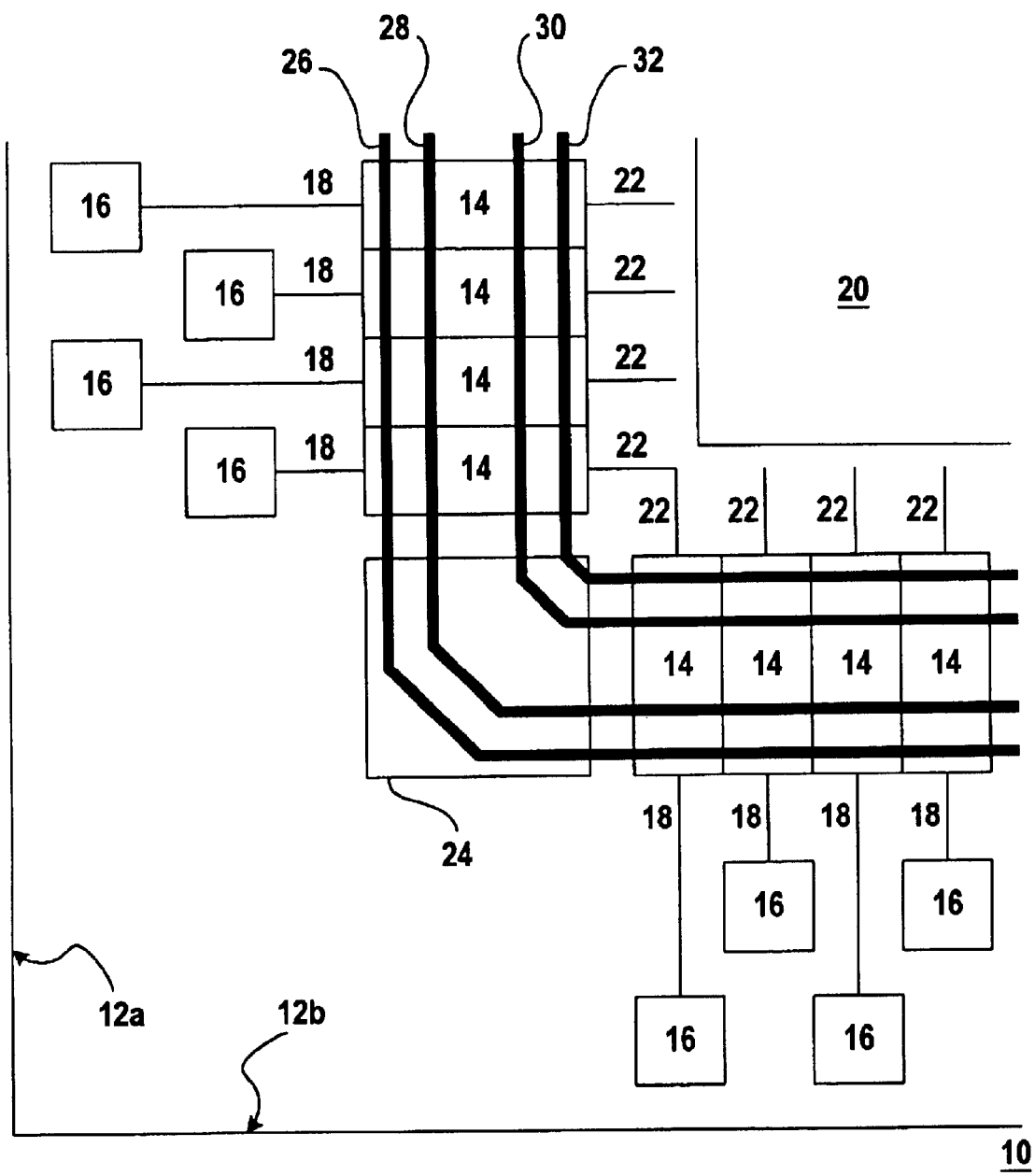
FIG. 3 is a top plan view of a prior art corner cell.
Figure 4:
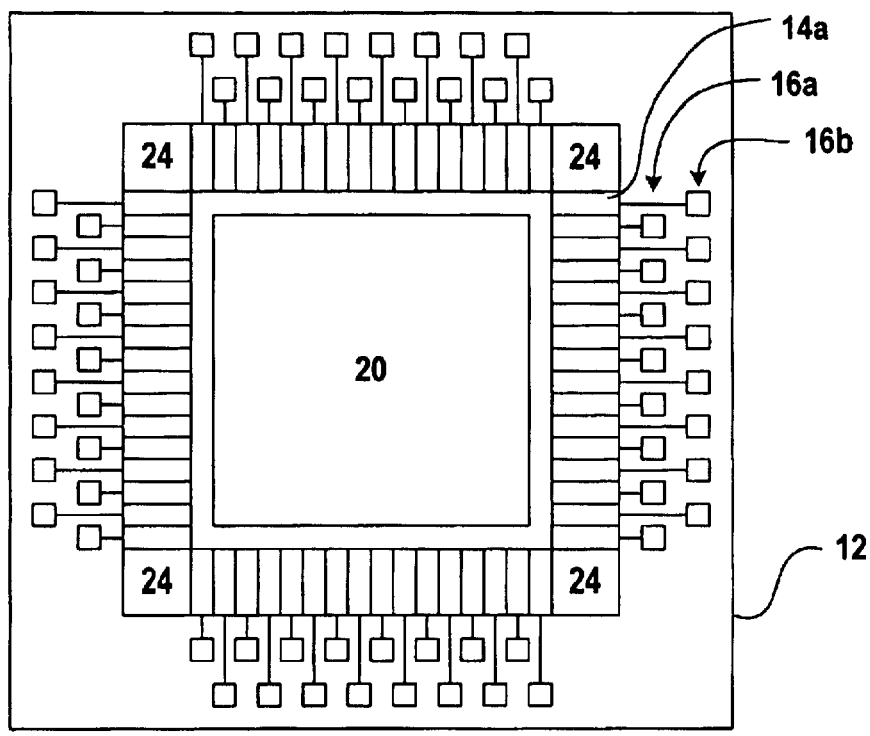
FIG. 4 is a top plan view of a prior art input output limited integrated circuit.
Figure 5:
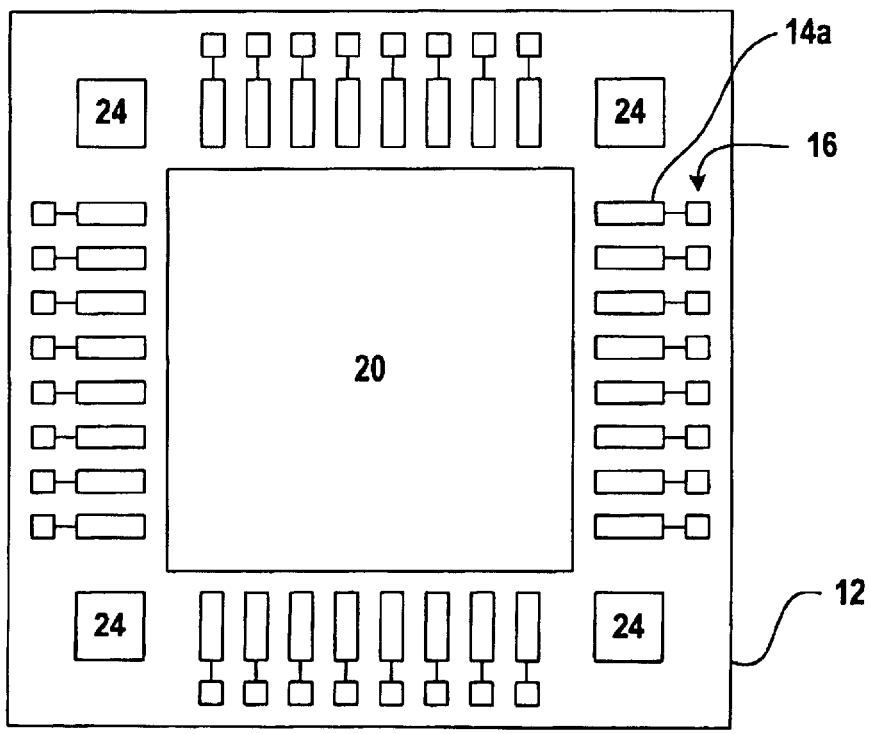
FIG. 5 is a top plan view of a prior art core limited integrated circuit.
Figure 9:
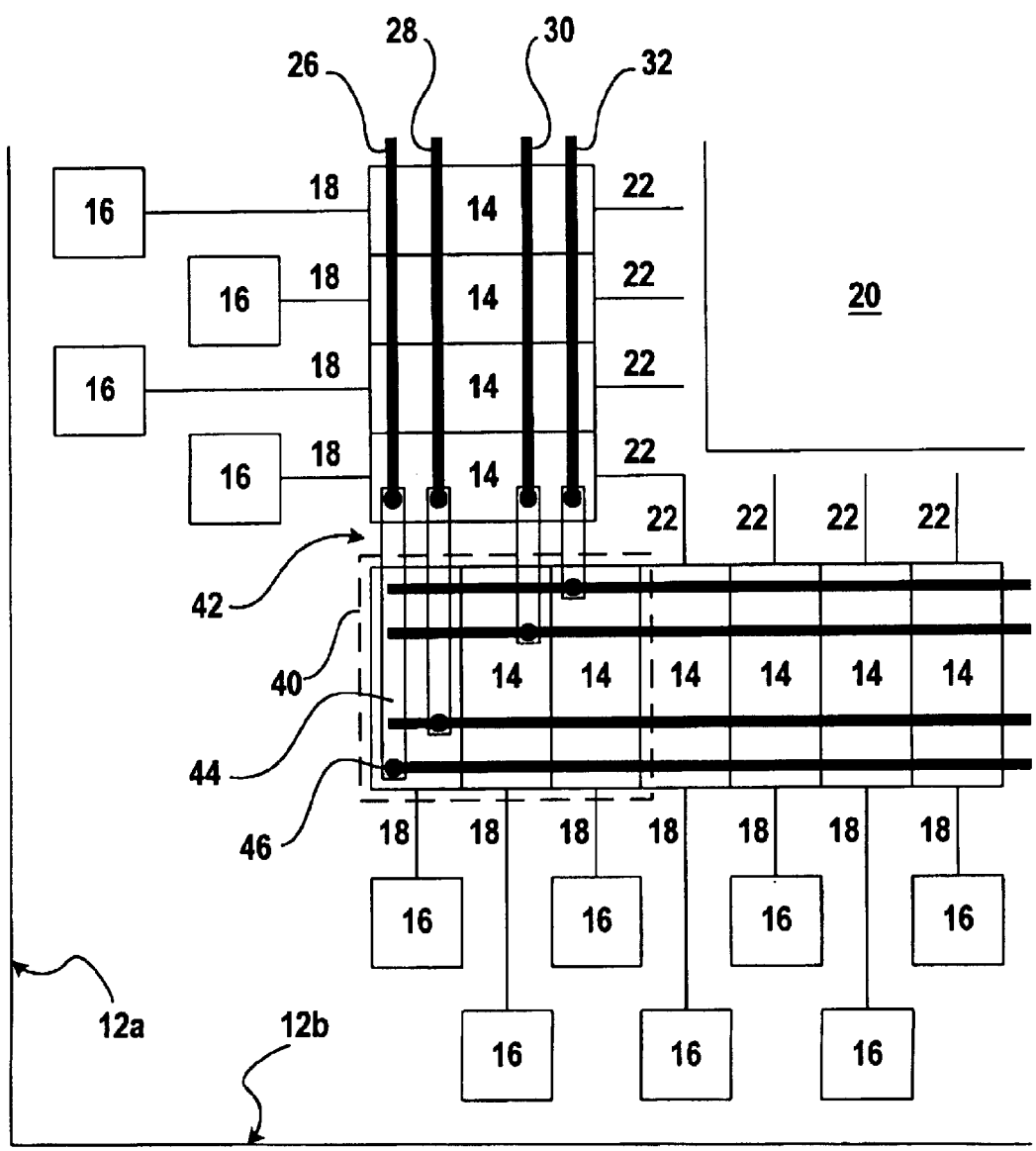
FIG. 9 is a top plan view of buss lines in a corner cell according to a preferred embodiment of the present invention.

With reference now to FIG. 9 there is depicted a corner portion 40 of an integrated circuit 10, in which the buss lines 26, 28, 30, and 32 extend clear along the peripheral edges 12a and 12b of the integrated circuit 10. In prior art integrated circuit 10 designs, such as depicted in FIG. 3, a corner cell 24 is placed in the corner portion 40 of the integrated circuit 10, and the buss lines 26, 28, 30, and 32 do not extend clear along the peripheral edges of the integrated circuit 10 as depicted in FIG. 9, but rather turn the corner as depicted in FIG. 3.

By extending the buss lines 26, 28, 30, and 32 as depicted in FIG. 9, additional input output cells 14 can be placed in the corner of the integrated circuit 10. As depicted in FIG. 9, these input output cells 14 are disposed along the peripheral edge 12b and the buss lines 26, 28, 30, and 32 disposed along that peripheral edge 12b extend closer to their adjoining peripheral edge than do those buss lines 26, 28, 30, and 32 that are disposed along the peripheral edge 12a. However, it is appreciated that this could have been reversed, with the buss lines 26, 28, 30, and 32 disposed along the peripheral edge 12a extending closer to their adjoining peripheral edge than those buss lines 26, 28, 30, and 32 that are disposed along the peripheral edge 12b.

The buss lines 26, 28, 30, and 32 are preferably disposed on a first set of layers of the integrated circuit 10, which is most preferably a single metal layer. The buss lines 26, 28, 30, and 32 disposed along the peripheral edge 12b are preferably electrically connected to the buss lines 26, 28, 30, and 32 disposed along the peripheral edge 12a by electrically conductive jumpers 44 and electrically conductive vias 46. The electrically is conductive jumpers 44 preferably reside on a second set of layers of the integrated circuit 10, which is most preferably a single metal layer that is disposed above the single metal layer on which the buss lines 26, 28, 30, and 32 reside. However, in alternate embodiments of the invention, the various buss lines 26, 28, 30, and 32 and electrically conductive jumpers 44 all reside on different layers, one from another, of the integrated circuit 10.

Most preferably there is left a small gap 42 between the adjacent rows of input output cells 14 that comprise a single ring around the peripheral edges 12 of the integrated circuit 10. The gap 42 is most preferably narrower than the width 34 of a single input output cell 14, and thus does not add substantially to the overall size of the integrated circuit 10.

The gap 42 may be used for purposes such as routing electrically conductive lines from an outer ring of bonding pads 16 to the core 20 of the integrated circuit 10.

Figure 10:
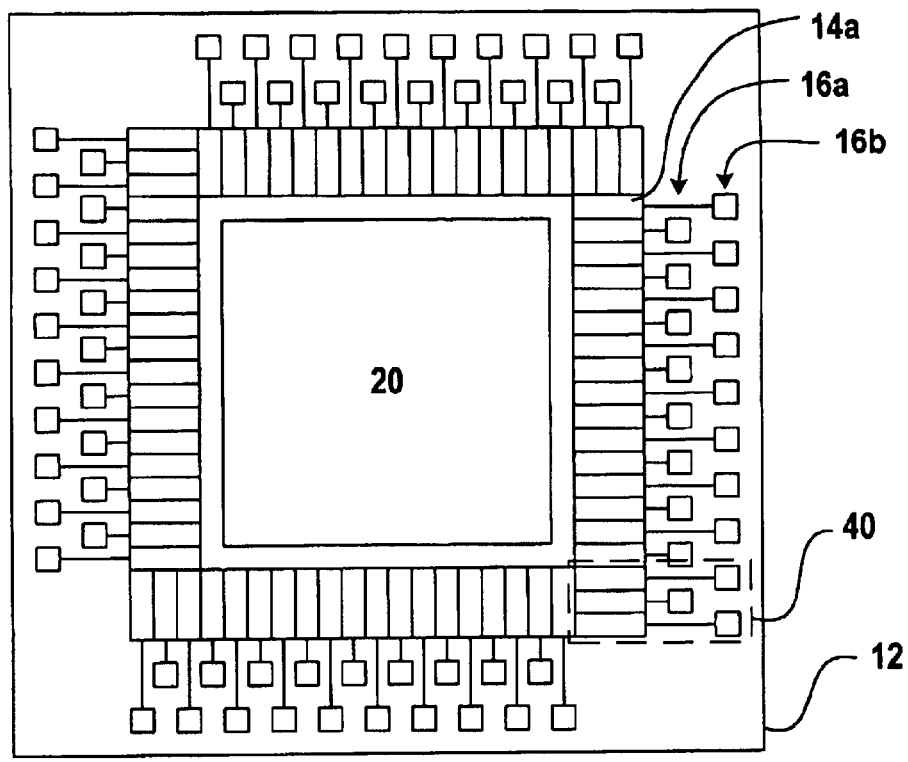
FIG. 10 is a top plan view of an integrated circuit with corner portions according to a preferred embodiment of the present invention.

Using the corner portions 40 of the integrated circuit 10 for input output cells 14 in this manner tends to be more beneficial for input output limited integrated circuits 10a than it is for core limited integrated circuits 10b. However, such a design can be employed in both situations. FIG. 10 depicts the additional input output cells 14a in the corner portion 40 of an input output limited integrated circuit 10a, which uses a prior art design for the input output cells 14a FIG. 11 depicts the additional input output cells 14c in the corner portion 40 of an input output limited integrated circuit 10a, which uses a design for the input output cells 14c according to the present invention.

In this manner, the size of the core 20 of the integrated circuit 10 can be maximized for a given surface area of the integrated circuit 10, or in other words, the surface area of the integrated circuit 10 can be minimized for a given desired core 20 size. Stated in yet another way, for a given integrated circuit 10, the present invention provides a method for minimizing the surface area required for the input output portion of the integrated circuit, including input output cells and bonding pads.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In an integrated circuit, the improvement comprising a first ring of first input output cells disposed new a peripheral edge of the integrated circuit, each of the first input output cells having an associated bonding pad disposed at a first relative position to each of the first input output cells, and a second ring of second input output cells disposed interior to the first ring of first input output cells, each of the second input output cells having an associated bonding pad disposed at a second relative position to each of the second input output cells, where the first relative position is of et from the second relative position.

2. The integrated circuit of claim 1, further comprising electrically conductive lines disposed between the offset bonding pads.

3. The integrated circuit of claim 1, further comprising power and ground bonding pads disposed between the first ring of first input output cells and the peripheral edge of the integrated circuit.

4. The integrated circuit of claim 1, wherein the first relative position is within a surface area of each of the first input output cells.

5. The integrated circuit of claim 1, wherein the second relative position is within a surface area of each of the second input output cells.

6. In an integrated circuit, the improvement comprising:
   electrically conductive buss lines disposed within a first set of layers along peripheral edges of the integrated circuit, electrically conductive jumpers disposed on a second set of layers in corners of the integrated circuit, and electrically conductive vias disposed in the corners of the integrated circuit for electrically connecting one of the electrically conductive buss lines disposed along a first peripheral edge of the peripheral edges with an associated one of the electrically conductive buss lines disposed along a second adjoining peripheral edge of the peripheral edges through an associated one of the electrically conductive jumpers.

7. The integrated circuit of claim 6, further comprising input output cells disposed within the corners of the integrate circuit and electrically connected to the electrically conductive buss lines.

8. The integrated circuit of claim 6, wherein the first set of layers is a single layer.

9. The integrated circuit of clam 6, wherein the second set of layers is a single layer.

10. The integrated circuit of claim 6, further comprising gaps between the electrically conductive buss lines disposed along the first peripheral edge and the electrically conductive buss lines disposed along the second adjoining peripheral edge, the gaps for routing electrically conductive lines from the peripheral edges of the integrated circuit to a core of the integrated circuit.

11. The integrated circuit of claim 10, wherein the gaps are narrower than a single input output cell.

* * * * *